(12) United States Patent
Nastasi et al.

(10) Patent No.: US 7,153,761 B1
(45) Date of Patent: Dec. 26, 2006

(54) METHOD OF TRANSFERRING A THIN CRYSTALLINE SEMICONDUCTOR LAYER

(75) Inventors: Michael A. Nastasi, Sante Fe, NM (US); Lin Shao, Los Alamos, NM (US); N. David Theodore, Mesa, AZ (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 11/243,010

(22) Filed: Oct. 3, 2005

(51) Int. Cl.
*H01L 21/322* (2006.01)

(52) U.S. Cl. ............... 438/475; 438/459; 438/311; 257/E21; 257/143; 257/335

(58) Field of Classification Search ............... 438/475, 438/474, 459, 503, 505, 506, 510, 513, 514, 438/311, 455, 630, 604, 680, 681, 660, 933, 438/752, 753
See application file for complete search history.

(56) References Cited

U.S. PATENT DOCUMENTS

| 4,846,931 | A   |   | 7/1989  | Gmitter et al. |         |
|-----------|-----|---|---------|----------------|---------|
| 5,374,564 | A   |   | 12/1994 | Bruel          |         |
| 5,877,070 | A   |   | 3/1999  | Goesele et al. |         |
| 6,291,313 | B1  | * | 9/2001  | Henley et al.  | 438/458 |
| 6,352,909 | B1  |   | 3/2002  | Usenko         |         |
| 6,486,041 | B1  | * | 11/2002 | Henley et al.  | 438/458 |
| 6,500,732 | B1  | * | 12/2002 | Henley et al.  | 438/459 |
| 6,573,126 | B1  | * | 6/2003  | Cheng et al.   | 438/149 |
| 6,713,326 | B1  |   | 3/2004  | Cheng et al.   |         |
| 6,790,747 | B1  | * | 9/2004  | Henley et al.  | 438/458 |
| 6,806,171 | B1  |   | 10/2004 | Ulyashin et al.|         |
| 2005/0070071 | A1 |  | 3/2005 | Henley et al.  |         |

OTHER PUBLICATIONS

Yonehara et al., "Epitaxial Layer Transfer by Bond and Etch Back of Porous Si," Appl. Phys. Lett. 64 (16), Apr. 1994.
Ishizaka et al., "Low Temperature Surface Cleaning of Silicon and Its Application to Silicon MBE," J.Electrochem Soc., Apr. 1986, vol. 133 (4), pp. 666-671.

* cited by examiner

*Primary Examiner*—David Nhu
(74) *Attorney, Agent, or Firm*—Samuel L. Borkowsky

(57) ABSTRACT

A method for transferring a thin semiconductor layer from one substrate to another substrate involves depositing a thin epitaxial monocrystalline semiconductor layer on a substrate having surface contaminants. An interface that includes the contaminants is formed in between the deposited layer and the substrate. Hydrogen atoms are introduced into the structure and allowed to diffuse to the interface. Afterward, the thin semiconductor layer is bonded to a second substrate and the thin layer is separated away at the interface, which results in transferring the thin epitaxial semiconductor layer from one substrate to the other substrate.

21 Claims, 3 Drawing Sheets

METHOD OF TRANSFERRING A THIN CRYSTALLINE SEMICONDUCTOR LAYER

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to silicon-on-insulator (SOI) wafers and more particularly to a method for transferring an ultrathin layer of monocrystalline semiconductor from one substrate to another.

BACKGROUND OF THE INVENTION

Past methods for producing silicon-on-insulator (SOI) wafers have involved epitaxial growth of silicon on an insulating substrate, or implantation of oxygen directly into silicon to form buried silicon dioxide layers (SIMOX™). In recent years, other methods have involved the transfer of a thin layer of semiconductor. One example of such a transfer method can be found in U.S. Pat. No. 4,846,931 to Gmitter et al. entitled "Method for Lifting-off Epitaxial Films". According to the '931 patent, an epitaxial film is grown on a single crystal substrate. Afterward, a thin release layer positioned in between the epitaxial film and the substrate is selectively etched away. As the release layer is removed, the edges of the epitaxial film curl upward and away from the substrate and the epitaxial layer is peeled away. This approach is presently unsuitable for the preparation of SOI wafers because it is limited for lift-off of a film having a small area (about 1 cm$^2$), while films having an area of 100 to 1000 cm$^2$ are presently required for the fabrication of SOI wafers.

A method for transferring monocrystalline layers over to thermally oxidized silicon handle wafers by bonding and single etch back of porous silicon is described by Yonehara et al. in "Epitaxial Layer Transfer by Bond and Etch Back of Porous Si", Applied Physics Letters, vol. 64, (1994) pp. 2108–2110. According to this paper, a thick substrate is made thinner by etching away the substrate until an etch stop (a porous silicon layer) is reached. The method has the disadvantage of the high cost to etch an entire semiconductor wafer.

Another method for transferring a semiconductor layer is described in U.S. Pat. No. 5,374,564 to Bruel, entitled "Process for the Production of Thin Semiconductor Material Films". According to the '564 patent, hydrogen ions are implanted into a semiconductor substrate, and then are transformed into a quasi-continuous hydrogen layer. This method has disadvantages of the requirement of a high fluence of hydrogen (above $5 \times 10^{16}$ cm$^{-2}$), the difficulty in transferring an ultra thin (<0.1 micron) layer, and the low crystalline quality of the transferred layer due to surface damage induced by the hydrogen ion implantation.

Attempts were made to improve the Bruel method. In U.S. Pat. No. 5,877,070 to Goesele et al. entitled "Method for the Transfer of Thin Layers of Monocrystalline Material to a Desirable Substrate," for example, a hydrogen-trap-inducing element such as boron or phosphorus is implanted into a substrate to create a disordered layer that divides the substrate into a lower portion (most of the substrate) and an upper portion that is transferred to a different substrate. After the creation of the disordered layer, hydrogen is implanted near the disordered layer and the substrate is then subjected to heat treatment. The upper portion of the substrate is then bonded to another substrate and the disordered layer is split, thereby transferring the upper portion (i.e. the thin layer) from the first substrate to the second substrate. While this method allows a somewhat reduced dosage requirement for the hydrogen implantation, it is still affected by the same problems as described above for the Bruel method.

U.S. Pat. No. 6,352,909 to Usenko entitled "Process for Lift-Off of a Layer From a Substrate" is concerned with another attempt at improving the Bruel method. The '909 patent describes forming a buried layer of defects by implantation. The buried defect layer is used to trap hydrogen. A disadvantage of this method is that the surface of the layer to be transferred is heavily damaged during the implantation and the damage is difficult to fix, even by annealing at a relatively high-temperature.

In U.S. Pat. No. 6,806,171 to Ulyashin et al. entitled "Method of Producing a Thin Layer of Crystalline Material," a porous silicon layer is created on a silicon substrate, and a nonporous epitaxial layer is grown on the porous layer. The porosity of the now-buried porous layer is increased by hydrogenation techniques, and then the epitaxial layer is cleaved from the sandwich structure at the porous layer. After cleavage, the transferred layer needs to be smoothened. Similar to all of the prior art methods mentioned above, this method does not provide any improvement on the smoothness of the transferred layer.

U.S. Patent Application 20050070071 and U.S. Pat. No. 6,790,747 to Henley et al., both entitled "Method and Device for Controlled Cleaving Process" disclose a controlled cleaving process that involves introducing H atoms directly into a stressed region by hydrogen ion implantation. Damage cascades created within the stressed region degrade the crystalline quality and increase the roughness of the transferred layer.

Two approaches that are described by Cheng et al. in U.S. Pat. No. 6,573,126 and in U.S. Pat. No. 6,713,326, both entitled "Process for Producing Semiconductor Article Using Graded Epitaxial Growth", involve using hydrogen ion implantation for lift-off of a semiconductor layer from a heterostructure that includes both a graded SiGe layer and a strain-relaxed SiGe layer. After thermal annealing, a zigzag network of microcracks results in a rough surface of the transferred layer. These approaches have the same limitations as those described by Bruel et al. in U.S. Pat. No. 5,374,564. In particular, a fluctuation in thickness as high as several tens of percent occurs when forming a layer of submicron thickness, and the formation of a uniform layer becomes a large problem for transferring a layer of material having a thickness of less than about 100 nanometers (1 nm=10$^{-9}$ m). The difficulty of forming a thin film with high crystalline quality becomes more severe with an increase in wafer diameter.

There remains a heed for a better method for transferring ultrathin layers of crystalline semiconductor material.

SUMMARY OF THE INVENTION

In accordance with the purposes of the present invention, as embodied and broadly described herein, the present invention includes a method for transferring a thin epitaxial semiconductor layer from one substrate to another substrate. The method involves providing a first substrate having a first surface having surface contaminants, and depositing a monocrystalline epitaxial semiconductor layer on the contaminated first surface, whereby a substantially non-porous interface including said surface contaminants is formed between the first substrate and the deposited monocrystalline epitaxial semiconductor layer. The deposited epitaxial layer is contacted with hydrogen atoms and hydrogen molecules. After the hydrogen is allowed to diffuse to the interface, a second substrate is bonded to the monocrystalline epitaxial layer to form an intermediate structure. Thereafter, the intermediate structure is separated at the interface, which results in the transfer of the monocrystalline epitaxial semiconductor layer from the first substrate to the second substrate.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 1a shows the introduction of hydrogen into a structure having a top layer of epitaxial monocrystalline semiconductor and a much thicker bottom substrate; FIG. 1b shows the bonding of the epitaxial monocrystalline silicon layer of the structure to a second substrate; and FIG. 1c shows the transferring of the layer of epitaxial monocrystalline semiconductor to the second substrate.

DETAILED DESCRIPTION

Briefly, the present invention is concerned with transferring a thin layer of crystalline semiconductor from a first substrate to a second substrate. A thin epitaxial monocrystalline semiconductor layer is deposited on the surface of a semiconductor substrate to form a structure. Hydrogen (and/or deuterium) atoms are introduced into the structure and allowed to diffuse into the interface between the epitaxial semiconductor layer and the first substrate. Afterward, the thin epitaxial monocrystalline semiconductor layer is bonded to a second substrate to form an intermediate structure. A direct wafer bonding or anodic bonding approach, or some other approach or approaches may be used to form a strong bond between the epitaxial layer and the second substrate. After bonding the epitaxial layer to the second substrate, the epitaxial semiconductor layer is separated by splitting at the interface between the semiconductor layer and the first substrate. The net result of the separation is the transfer of the thin epitaxial monocrystalline semiconductor layer from the first substrate to the second substrate.

Reference will now be made in detail to the present preferred embodiments of the invention. Similar or identical structures are identified using identical callouts. A schematic representation of the method of the present invention is illustrated in FIGS. 1a, 1b, and 1c.

Figure 1A:
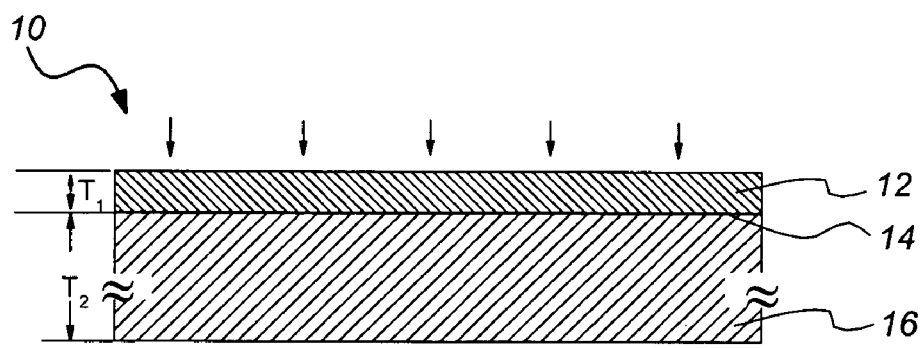
FIGS. 1a–1c show schematic representations that illustrate the method of the invention.
Figure 1B:
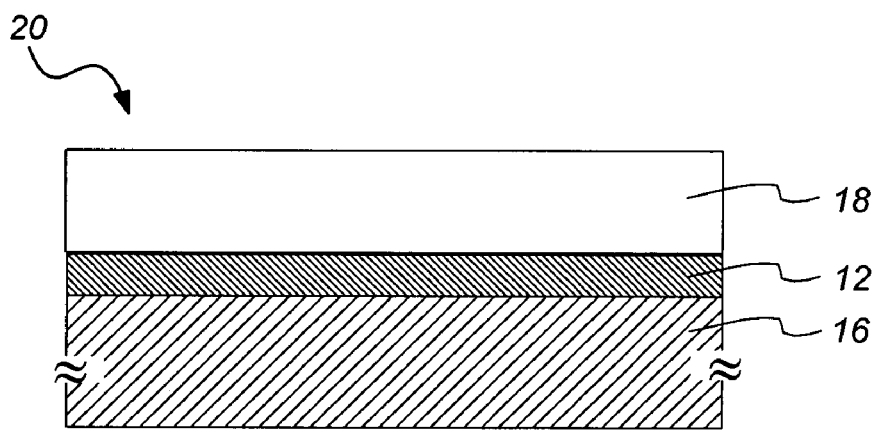
Figure 1C:
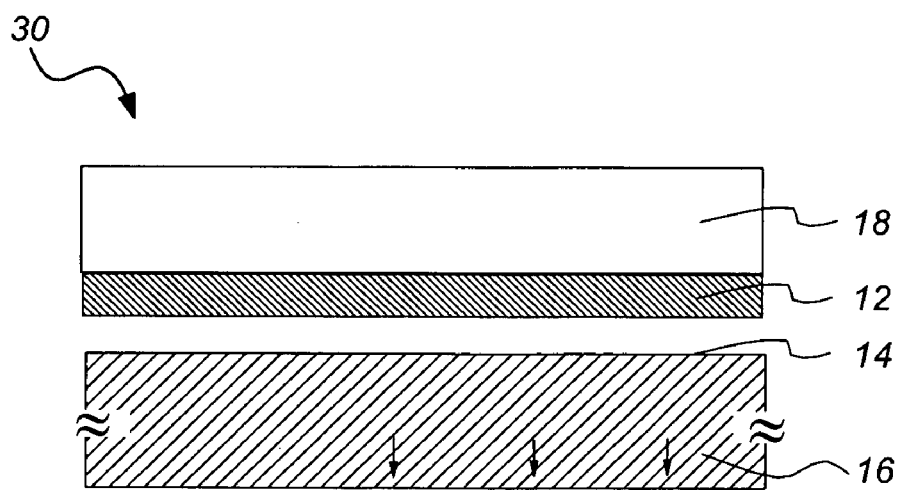

FIG. 1a shows structure 10, which includes a thin epitaxial monocrystalline semiconductor layer 12, a thick substrate layer 16, and an interface 14 in between thin layer 12 and substrate layer 16.

Interface 14, also referred to herein as a controlled contamination layer, may be a plurality of domains of contaminants in between thin layer 12 and substrate layer 16. The contaminants, which are impurities other than the substrate materials, form a barrier that prevents some of the atoms of substrate 16 from forming chemical bonds with atoms of the thin epitaxial monocrystalline semiconductor layer 12. Interface 14, which prevents a complete bonding between layer 12 and layer 16, is exploited during the invention as a means for trapping hydrogen atoms before layer 12 is separated from structure 10. The contaminants are introduced in a controlled manner such that they do not prevent the growth of the epitaxial layer 12, and they also do not induce significant defects that diminish the crystalline quality of deposited layer 12. Interface 14 is preferably a plurality of islands of contaminants, or a sub-monolayer, with a thickness ranging from less than about 1 nanometer to several nanometers.

Interface 14 may be introduced by ex situ processes such as chemical dipping or chemical mechanical polishing or by in situ processes such as exposing the substrate to impurity vapors prior to the deposition of epitaxial layer 12.

The contaminants can be organic or inorganic, and include, but are not limited to, oxygen contaminants, hydrogen contaminants, fluorine contaminants, carbon contaminants, contaminants of one or more metals, or mixtures or compounds of these contaminants. In one embodiment, the layer 12 and the layer 16 are silicon, and the controlled contaminant layer is islands or a sub-monolayer of silicon oxide. In another embodiment, the controlled contaminant layer is islands or a sub-monolayer of a hydrocarbon layer.

These contaminants generally exist in various cleaning solutions. In one example, the controlled contamination is introduced through a surface-cleaning process that is performed before the growth of semiconductor layer 12. The cleaning process may involve wet-chemical cleaning, dry cleaning, ultraviolet-ozone cleaning, vapor phase wafer cleaning, plasma cleaning, or a combination of above processes. In an embodiment, the cleaning involves dipping the first substrate into diluted hydrofluoric acid (HF). In another embodiment, the first substrate experiences a cleaning process described by Ishizaki et al. in "Low Temperature Surface Cleaning of Silicon and its Application to Silicon MBE", Journal of the Electrochemical Society, vol. 133, pp. 666–671, April 1986. This process, which is sometimes known in the art as a "Shiraki" cleaning process, includes the steps of (1) dipping the substrate into a solution of HF followed by rinsing with water; thereafter (2) dipping the substrate into a solution of boiling nitric acid ($HNO_3$) followed by rinsing in water; thereafter (3) dipping the substrate into a dilute solution of HF followed by rinsing in water; thereafter (4) dipping the substrate into a boiling 1:1:3 $NH_4OH:H_2O_2:H_2O$ solution followed by rinsing with water; thereafter (5) dipping the substrate into a dilute solution of HF followed by rinsing with water; and thereafter (6) dipping the substrate into a boiling 3:1:1 $HCl:H_2O_2:H_2O$ solution followed by rinsing with water. In another embodiment, the first substrate experiences a cleaning procedure of a type developed at the Radio Corporation of America (RCA) and described by Kern et al. in "Cleaning Solution Based on Hydrogen Peroxide for Use in Semiconductor Technology", *RCA Review*, June 1970, pp. 187–206. This type of procedure, which is sometimes known in the art as an RCA cleaning procedure, has the following three major sequential steps: (1) dipping the substrate into an aqueous solution of ammonium hydroxide and hydrogen peroxide (5:1:1$H_2O$:$H_2O_2$:$NH_4OH$); thereafter (2) dipping the substrate into a dilute aqueous solution of HF (50:1$H_2O$:HF); and thereafter (3) dipping the substrate into an aqueous solution of hydrogen peroxide and hydrochloric acid (6:1:1$H_2O$:$H_2O_2$:HCl). In the aforementioned embodiments, the level of surface contamination may be controlled by adjusting the dipping period, or by changing the components of the cleaning solutions.

Layer 12 has a thickness $T_1$ of from about 10 Angstroms to about 100,000 Angstroms. In certain embodiments, $T_1$ is less than 2000 Angstroms. Layer 16 has a thickness $T_2$ of from about 1 micrometer (μm) to about 1000 μm (1 μm=$10^{-6}$ meters). In certain embodiments, $T_2$ is less than about 600 μm.

Layer 12 is an epitaxial layer of semiconductor materials. These materials include, but are not limited to, group IV materials, group III-V compound materials, group II-VI compound materials, and group III-nitride materials. Group III-V compound materials are materials made from a group III element and a group V element. Group II-VI compound materials are materials made from a group II element and a group VI element. Preferred group IV materials include Si, Ge, $Si_{1-y}C_y$, $Si_{1-x-y}C_xGe_y$, or $Si_{1-y}Ge_y$, where x and y are in the range of from about 1 to about 100 percent. Preferred group III-V compound materials include, but are not limited to, aluminum phosphide (AlP), aluminum arsenide (AlAs), aluminum antimonide (AlSb), gallium phosphide (GaP), gallium arsenide (GaAs), gallium antimonide (GaSb), indium phosphide (InP), indium arsenide (InAs), and indium antimonide (InSb). Preferred group II-VI compound materials include, but are not limited to, zinc oxide (ZnO), zinc sulfide (ZnS), zinc selenide (ZnSe), zinc telluride (ZnTe), cadmium sulfide (CdS), cadmium selenide (CdSe), cadmium telluride (CdTe), mercuric sulfide (HgS), mercuric selenide (HgSe), and mercuric telluride (HgTe). Preferred group III-nitride compound materials include, but are not limited to, aluminum nitride (AlN), gallium nitride (GaN), and indium nitride (InN).

The growth of layers 12 and 16 to form the first structure 10 may be accomplished by any known method for depositing layers of semiconductor materials. These methods include, but are not limited to, thermal chemical vapor deposition (CVD), reduced-pressure chemical vapor deposition, molecular beam epitaxy (MBE), low temperature molecular beam epitaxy, ion beam assisted deposition (IBAD) and sputtering. In some preferred embodiments, layer 12 is grown by one of the methods mentioned above and layer 16 (or part of layer 16) is grown by techniques known in the art as "Czochralski Crystal Growth" or "Float Zone Crystal Growth". Usually, layer 16 has a high degree of chemical purity, a high degree of crystalline perfection, and high structure uniformity.

In an embodiment, the growth of layer 12 is realized by chemical vapor deposition. Silane ($SiH_4$) source gas, for example, may be used to deposit a monocrystalline silicon layer 12. Usually, a high growth rate is readily achieved by deposition at high chemical vapor deposition temperatures. The high temperatures may also reduce the incorporation of impurities and improve layer uniformity. Adequate growth rates, i.e., >0.01 Angstrom/s using $SiH_4$ may be attained at a temperature of about 550 degrees Celsius.

After the fabrication of structure 10, hydrogen atoms are introduced into structure 10. Hydrogenation by hydrogen plasma is a presently preferred embodiment. Hydrogenation of structure 10 can be achieved by forming ionized hydrogen plasma about structure 10 within an enclosing chamber and by applying repetitive high voltage negative pulses to structure 10 to drive the hydrogen ions into exposed surfaces of the structure 10. It should be understood that hydrogenation may involve using hydrogen comprises normal hydrogen atoms (H), deuterium atoms (D), hydrogen molecules ($H_2$), deuterium molecules ($D_2$), hydrogen deuterium (HD), and mixtures thereof.

Hydrogenation is performed with the structure 10 at an elevated temperature for a duration long enough to introduce enough hydrogen into structure 10 and diffuse the hydrogen into the interface 14 where at least some of hydrogen atoms are trapped. Sub-surface microcracks may be formed during this stage, but the temperature of structure 10 should be controlled below the temperature at which significant blistering of the surface of structure 10 occurs. The energy of the hydrogen used for hydrogenation is in the range of about 50 eV to about 100 keV. In some embodiments, the energy of the hydrogen is below 1 keV, and the hydrogenation temperature is below about 600 degrees Celsius, and the hydrogenation duration is less than 10 hours. In an embodiment, the energy of the hydrogen is 500 eV and the substrate temperature is about 300 degrees Celsius and hydrogenation duration is less than about 3 hours.

The substrate growth temperature has an effect on the hydrogen diffusion behavior. Several <100> Si/Si homoepitaxial structures were grown using molecular beam epitaxy (MBE) at temperatures in the range of from about 500 degrees Celsius to about 800 degrees Celsius. In this range, the higher the temperature, the deeper the hydrogen diffusion. For the structure grown at 800 degrees Celsius, hydrogen trapping was found to occur at the interface between the substrate and the epitaxial monocrystalline silicon layer. Consequently, microcracks were produced at the interface prior to splitting the epitaxial layer from the substrate. While not intending to be bound by any particular explanation, it is believed that the diffusion phenomena can be explained by interactions between hydrogen atoms and vacancy-type defects in the epitaxial silicon layer; the density of the defects decreases with increasing growth temperature. The long-range migration and interface trapping of hydrogen occur primarily in the monocrystalline epitaxial silicon layer having a low density of trap defects.

FIG. 1b shows a schematic representation of structure 20 produced after bonding the monocrystalline epitaxial semiconductor layer 12 to the second substrate 18. The second substrate 18 is preferably a material selected from silicon, germanium, oxidized silicon, glass, fused quartz, sapphire, gallium nitride, and silicon carbide. An intimate and strong bond between layer 12 and substrate 18 may be realized using, for example, direct wafer bonding or anodic bonding.

FIG. 1c shows a schematic representation of the transfer of ultrathin monocrystalline semiconductor layer 12 onto second substrate 18 to form structure 30. This stage may involve the heat treatment of the structure 20 (FIG. 1b), which results in separation of the ultrathin epitaxial monocrystalline semiconductor layer 12 at interface 14. This stage may also involve applying an external force to structure 20 at interface 14. External forces include, but are not limited to, bending structure 10, or using liquid fluid, or using a solid razor blade, or a gas blade to cleave heterostructure at the interface 14. In any case, the separation is controlled to happen at the interface 14.

The heat treatment in the stage of layer transfer is usually at a temperate above about 500 degrees Celsius. It is expected that the threshold temperature for layer transfer may be lower than temperatures usually required by other methods, which would greatly benefit the layer transfer if substrate 18 has a thermal expansion coefficient that is very different from that of the transferred layer (i.e. layer 12).

Figure 2:
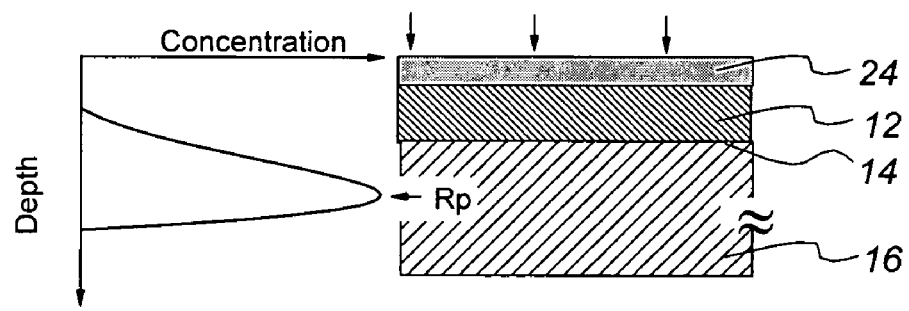
FIG. 2 shows a schematic representation of the introduction of hydrogen into the structure of FIG. 1 by hydrogen ion implantation.

Hydrogenation by hydrogen plasma is a presently preferred embodiment to introduce hydrogen atoms into structure 10. Various methods to introduce hydrogen can be used alternatively. In an embodiment exemplified by FIG. 2, hydrogen ion implantation is used to introduce hydrogen into structure 10. The distribution of the implanted hydrogen in structure 10 usually has a Gaussian-like shape with its concentration peaked at a location denoted in FIG. 2 by Rp (the projected range). The Rp may be controlled by varying the hydrogen ion implantation energy. Typically, the implantation energy is in a range from about 50 eV to about 200 keV. The Rp may be controlled to be either shallower or deeper than the location of interface 14. The implanted hydrogen should be able to migrate and to be trapped at interface 14. The hydrogen migration and trapping may occur during ion impanation or during thermal annealing after implantation. The temperature of the substrate during ion implantation should be controlled to be low enough to avoid the quick diffusion and escape of implanted hydrogen from the surface. Usually, the implantation temperature should be below about 500 degrees Celsius. The temperature of the first substrate and the deposited monocrystalline epitaxial layer during hydrogen implantation is from about minus 196 degrees Celsius to about 500 degrees Celsius. Preferably, the temperature is from about room temperature to about 500 degrees Celsius.

In an embodiment of the invention, structure 10 may optionally include encapsulating layer 24 (shown in FIG. 2) on monocrystalline semiconductor layer 12. Encapsulating layer 24 also offers a protective function by minimizing unwanted contamination of the structure. In an embodiment, layer 12 is silicon and encapsulating layer 24 is silicon oxide with a thickness of from about 10 nm to about 1000 nm. Encapsulating layer 24 may be removed after the implantation by, for example, gas phase etching or by dipping the structure 10 into a dilute solution of acid (HF, for example). Formation and etching of encapsulating layer 24 later can help to reduce the thickness of layer 12 which is to be bonded and transferred. Encapsulating layer 24 can, however, be left in place and be directly bonded to substrate 18.

Figure 3:
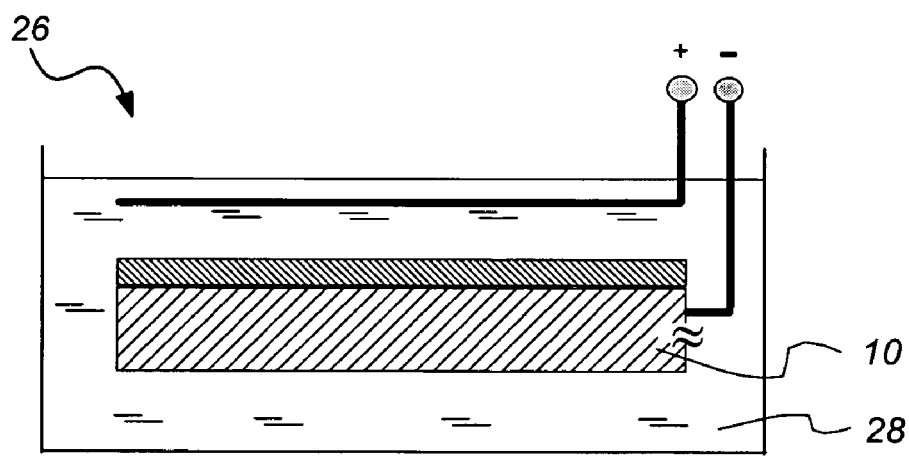
FIG. 3 shows a schematic representation of the introduction of hydrogen into the structure of FIG. 1 by an electrolytic process.

In a still further particular embodiment, the introduction of hydrogen into structure 10 may be realized electrolytically. FIG. 3 is a schematic representation of an electrolytic set-up 26 for introducing hydrogen into structure 10. As FIG. 3 shows, structure 10 is in electrolytic contact with electrolyte 28. When electrolyte 28 decomposes during the electrolysis, monatomic hydrogen is produced. A suitable electrolyte should be chosen in order to avoid significant damage to the surface of structure 10 by oxidation or etching. Suitable electrolytes include, but are not limited to, acids such as $H_3PO_4$, HF, HCl, $H_2SO_4$, and $CH_3COOH$. After the electrolysis, an appropriate surface cleaning may be performed to remove the hydrogen-rich surface.

The EXAMPLE that will now be described relates to the lift-off process to transfer a thin film in a monocrystalline silicon wafer with the aid of plasma hydrogenation. The EXAMPLE is given to illustrate an embodiment of the present invention, and it should be understood that the present invention is not limited to only this embodiment.

EXAMPLE

A 640-nm thick epitaxial Si layer was grown on a <100> 500 Ω-cm p-type Si substrate. The silicon substrate was first cleaned as follows. The substrate was dipped into an aqueous 4% HF solution, then rinsed with water, then dipped into a solution of boiling nitric acid for about 10 minutes, and afterward rinsed with water. Subsequently, the substrate was dipped into an aqueous 4% solution of HF for about 20 seconds, then rinsed with water, and then dipped into a boiling aqueous solution of ammonium hydroxide and hydrogen peroxide 1:1:3 $NH_4OH:H_2O_2:H_2O$) for about 10 minutes. After rinsing with water, the substrate was dipped into an aqueous 4% solution for about 20 seconds, dried using nitrogen gas, and then immediately loaded into a vacuum system. A thin epitaxial layer of silicon was grown on the substrate by molecular beam epitaxy (MBE). The silicon molecular beam was obtained from an elemental source in an electron gun evaporator. During the growth, the substrate temperature was maintained at about 800 degrees Celsius.

Figure 4A:
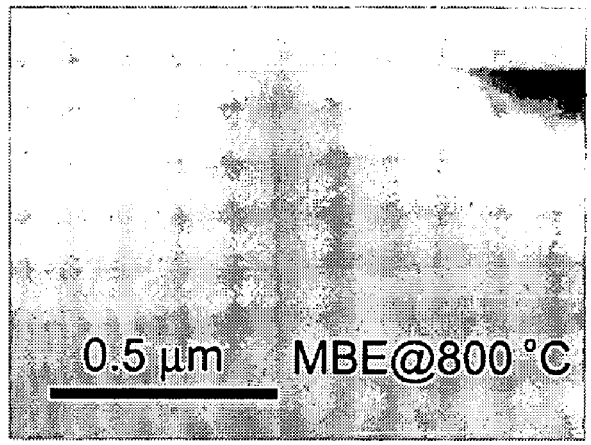
FIG. 4a shows a transmission electron microscopy (TEM) image of a sample of epitaxial monocrystalline silicon on a silicon substrate before plasma hydrogenation. The sample was prepared by depositing a 640-nm thick epitaxial silicon layer on a silicon substrate using molecular beam epitaxy (MBE) at a temperature of about 800 degrees Celsius.

A transmission electron micrograph (TEM) image of the resulting structure is shown in FIG. 4a. No extended defects or large defect clusters are apparent within the thin epitaxial layer. The interface between the Si substrate and the thin Si layer grown on the substrate is not observable from the TEM micrograph.

Figure 4B:
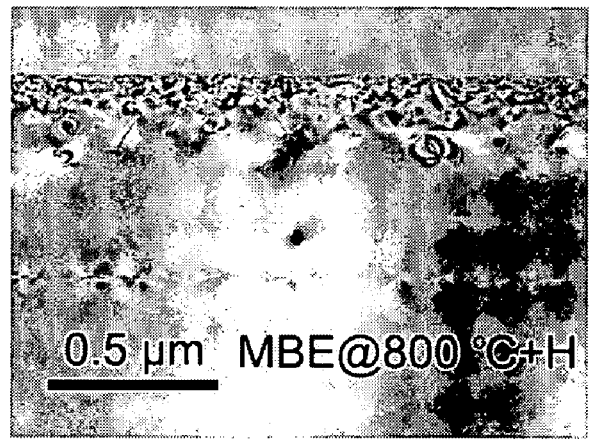
FIG. 4b shows a TEM image of the sample after plasma hydrogenation.

The structure was subjected to plasma hydrogenation using a reactive hydrogen ion etching system that provided hydrogen plasma with a bias of about −500 V. The structure was exposed to the hydrogen plasma for about 3 hours. During plasma exposure, the sample temperature is estimated to be about 250 degrees Celsius. A TEM image of the structure after hydrogenation is shown in FIG. 4b. As the TEM image shows, a band of platelets with (111) crystal orientations has formed near the surface. Most importantly, for this EXAMPLE, (100) oriented microcracks formed at the original interface between the thin epitaxial layer and the substrate.

The formation of continuous microcracks parallel to the Si surface is critical for the layer transfer for the fabrication of silicon-on-insulator wafers. The growth and joining of these microcracks allows the surface layer to become completely separated from the substrate. Thus, the EXAMPLE demonstrates that the blistering location can be controlled, and is at the interface between the deposited thin epitaxial layer and the substrate. Thus, conventional ion implantation steps are not required. Furthermore, using the interface as a H trapping layer avoids the possibility of unwanted contamination from impurities that are unavoidably implanted using conventional ion-cut methods to create trapping regions for hydrogen atoms.

The method of the present invention provides several advantages: 1) the ability to control cleavage at the interface; 2) the ability to reduce the surface roughness of the transferred layer as a result of smoother cleavage; 3) the ability to improve the crystalline quality of the transferred layer; and 4) the ability to improve the chemical purity of the transferred layer.

The interfacial cracking occurs only if significant hydrogen atom trapping occurs at the interface. For a thin layer of monocrystalline epitaxial silicon grown at low temperature using molecular beam epitaxy, defects in the thin layer limit the hydrogen atom penetration and prevent interfacial hydrogen atom trapping. Therefore, to realize controllable cracking at the interface, it is critical to control the growth conditions of the deposited epitaxial layer in order to provide a high crystalline quality and a low defect density such that sufficient hydrogen atoms diffuse to the interface so that interfacial cracking may occur. The adjustable parameters for high crystalline quality film growth by MBE include, but are not limited to the chamber pressure, substrate temperature, and evaporation rates.

For a thin monocrystalline epitaxial semiconducting layer grown using chemical vapor deposition (CVD), the adjustable parameters are similar to those for growth using MBE, but also include the deposition chemistry and reaction path of chemical precursors. For a thin monocrystalline epitaxial semiconducting layer grown using Ion Beam Assisted Deposition (IBAD) (see, for example: Nastasi et al. in Ion-Solid Interactions: Fundamentals and Applications, chapter 13, Cambridge University Press, 1996), additional adjustable parameters include the type, the energy and the flux of the ions bombarding a growing film.

In summary, the present invention relates to transferring a thin monocrystalline semiconductor layer from one substrate to another. The disclosed process permits fabrication of a silicon-on-insulator (SOI) wafer having an ultra thin silicon layer of controllable thickness. The present invention provides advantages of crystalline quality, chemical purity, surface smoothness, and controllability of the thickness of the transferred layer.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. Although the invention has been disclosed with reference to its preferred embodiments, from reading this description those of skill in the art can appreciate changes and modifications that may be made which do not depart from the scope and spirit of the invention as described above and claimed hereafter. It is intended that the scope of the invention be defined by the claims appended hereto.

What is claimed is:

1. A method for transferring a thin epitaxial semiconductor layer from one substrate to another substrate comprising:
   providing a first substrate having a first surface having surface contaminants;
   depositing a monocrystalline epitaxial semiconductor layer on the contaminated first surface whereby a substantially non-porous interface including the surface contaminants is formed between the first substrate and the deposited monocrystalline epitaxial semiconductor layer;
   contacting the monocrystalline epitaxial semiconductor layer with hydrogen atoms and hydrogen molecules and allowing the hydrogen to diffuse to the substantially non-porous interface;
   bonding the layer of monocrystalline epitaxial semiconductor layer to a second substrate to form an intermediate structure; and
   separating the intermediate structure at the substantially non-porous interface between the first substrate and the monocrystalline epitaxial semiconductor layer, thereby transferring the monocrystalline epitaxial semiconductor layer from the first substrate to the second substrate.

2. The method of claim 1, wherein the surface contaminants are provided by exposing the first substrate to a solution comprising at least one chemical selected from the group consisting of $H_2O$, $H_2O_2$, $H_2SO_4$, HF, $NH_4OH$, HCl, $H_3PO_4$, and $CH_3COOH$.

3. The method of claim 1, wherein the monocrystalline epitaxial semiconductor layer is deposited by molecular beam epitaxy, chemical vapor deposition, metal-organic vapor phase epitaxy, sputtering, or ion beam assisted deposition.

4. The method of claim 1, further comprising heating the first substrate at an elevated temperature while depositing the monocrystalline epitaxial semiconductor layer on the first substrate to minimize defects in the epitaxial monocrystalline layer.

5. The method of claim 1, wherein the step of contacting the monocrystalline epitaxial layer with hydrogen comprises plasma hydrogenation.

6. The method of claim 5, further comprising adjusting the temperature of the first substrate and deposited monocrystalline epitaxial layer during plasma hydrogenation such that blistering on the surface is minimized.

7. The method of claim 1, wherein the step of contacting the monocrystalline epitaxial layer with hydrogen comprises hydrogen ion implantation, wherein hydrogen comprises normal hydrogen atoms (H), deuterium atoms (D), hydrogen molecules (H2), deuterium molecules (D2), hydrogen deuterium (HD), and mixtures thereof.

8. The method of claim 7, wherein the temperature of the first substrate and the deposited monocrystalline epitaxial layer during hydrogen implantation is from about minus 196 degrees Celsius to about 500 degrees Celsius.

9. The method of claim 1, wherein the step of separating the intermediate structure comprises heating the intermediate structure at a temperature high enough to produce cracks at the interface.

10. The method of claim 1 wherein the step of contacting the monocrystalline epitaxial layer with hydrogen comprises electrically connecting the layer to an electrolytic cell and exposing the layer to an electrolyte in the electrolytic cell, wherein at least some of the electrolyte dissociates to produce hydrogen ions.

11. The method of claim 1, wherein separating the intermediate structure at the interface comprises subjecting the intermediate structure to an externally applied force.

12. The method of claim 1, wherein providing a first substrate comprises forming an islanded layer of contaminants on a surface of the first substrate.

13. The method of claim 1, wherein the deposited epitaxial semiconductor layer has a thickness less than 2000 Angstroms.

14. The method of claim 1, wherein the deposited epitaxial semiconductor layer is a material of the formula $Si_{1-y}C_y$, $Si_{1-x-y}C_xGe_y$, or $Si_{1-y}Ge_y$, where x and y are in the range of from about 1 percent to about 100 percent.

15. The method of claim 1, wherein the deposited epitaxial semiconductor layer is silicon and the first substrate is silicon.

16. The method of claim 1, wherein the contaminants comprise hydrogen, carbon, oxygen, fluorine, chlorine, sulfur, or combinations thereof.

17. The method of claim 15, wherein the second substrate comprises silicon, oxidized silicon, glass, quartz, sapphire or combinations thereof.

18. The method of claim 15, further comprising forming an encapsulating layer of silicon dioxide on the monocrystalline epitaxial layer before introducing hydrogen atoms into the monocrystalline epitaxial layer.

19. The method of claim 1, wherein the deposited monocrystalline epitaxial semiconductor layer is a group III-V compound material selected from the group consisting of AlP, AlAs, AlSb, GaP, GaAs, GaSb, InP, InAs, and InSb.

20. The method of claim 1, wherein the deposited monocrystalline epitaxial semiconductor layer is a group II-VI compound material selected from the group consisting of ZnO, ZnS, ZnSe, ZnTe, CdS, CdSe, CdTe, HgS, HgSe, and HgTe.

21. The method of claim 1, wherein the deposited monocrystalline epitaxial semiconductor layer is a group III nitride compound material selected from the group consisting of AlN, GaN, and InN.

* * * * *